United States Patent [19]

Gilpin et al.

[11] Patent Number: 5,554,822
[45] Date of Patent: Sep. 10, 1996

[54] SEALABLE, LATCHABLE DOOR FOR SECURING AND PROTECTING A PC MEMORY CARD

[75] Inventors: David Gilpin, Everett; John M. Bishay, Mukilteo, both of Wash.

[73] Assignee: Intermec Corporation, Everett, Wash.

[21] Appl. No.: 151,066

[22] Filed: Nov. 10, 1993

[51] Int. Cl.⁶ .................................................. H05K 5/06
[52] U.S. Cl. .......................... 174/52.3; 220/335; 220/526; 220/531; 361/684
[58] Field of Search ............................ 174/52.1, 52.3, 174/52.5; 361/600, 679, 684, 720, 722, 725, 726, 727, 732, 736, 737, 740, 741, 747, 756, 759; 220/4.02, 526, 531, 315, 334, 335, 336, 353; 235/439, 462

[56] References Cited

U.S. PATENT DOCUMENTS

| | | | |
|---|---|---|---|
| 3,746,207 | 7/1973 | Lenhart | 220/36 |
| 4,308,972 | 1/1982 | McReynolds et al. | 220/335 |
| 4,689,722 | 8/1987 | Debus et al. | 361/391 |
| 5,072,334 | 12/1991 | Burgess et al. | 361/428 |
| 5,299,089 | 3/1994 | Lwee | 439/159 X |
| 5,316,168 | 5/1994 | Finch et al. | 220/341 |
| 5,337,215 | 8/1994 | Sunderland et al. | 429/97 X |
| 5,358,135 | 10/1994 | Robbins et al. | 220/337 |
| 5,440,111 | 8/1995 | Eastman et al. | 235/462 |
| 5,442,514 | 8/1995 | Hopkins | 220/345 X |

Primary Examiner—Laura Thomas
Assistant Examiner—Christopher Horgan
Attorney, Agent, or Firm—Seed and Berry LLP

[57] ABSTRACT

A sealable, latchable door assembly for use with a hand-held, portable electronic device that has a housing adapted to removably receive a memory card in a receiving chamber through an opening. The door assembly includes a door shaped and sized to removably cover and seal the opening in the housing to retain and protect the memory card. The door has an engaging face adapted to sealably engage the housing around the opening. A connecting member attached to the door is slidably mounted within the housing to allow the door assembly to be slid between an extended, disengaged position and a retracted position with the door in a closed, sealed position. A latch attached to the door is adapted to releasably engage the housing to secure the door in the closed, sealed position. A hinge connected between the door and the connecting member enables the door to be pivoted downward to an open position to allow uninhibited passage of the memory card through the opening in the housing. The connecting member is slidably retained by guide channels in the housing.

20 Claims, 5 Drawing Sheets

SEALABLE, LATCHABLE DOOR FOR SECURING AND PROTECTING A PC MEMORY CARD

TECHNICAL FIELD

The present invention relates to retention assemblies for computer memory devices, and more particularly, to door assemblies for retaining computer memory devices.

BACKGROUND OF THE INVENTION

Computers, including hand-held computers, are extensively used in industry to facilitate the efficient and timely completion of a wide variety of tasks. Many processes for which computers are used require large data storage capacity and fast data processing capabilities. The speed, data storage, and data transfer capabilities in conjunction with the typically smaller size for a hand-held computer have allowed users to become very mobile and much more efficient in accomplishing what had been laborious jobs. In an effort to increase a computer's versatility, computers have been created or retrofitted to accept operator removable, interchangeable memory devices, such as expanded memory cards that can be inserted into a compatible computer to expand the computer's memory capability. Other cards are available to provide the computer with modem, fax, cellular communication, or Local Area Network capabilities. Thus, the same hand-held computer can be used with one of many memory devices depending upon a particular task at hand.

The Personal Computer Memory Card International Association (PCMCIA) developed a manufacturing standard that has been widely developed and adopted by manufactures of memory cards and associated computer hardware and software. Hand-held computers utilizing PCMCIA memory cards or other operator removable, replaceable memory devices, hereinafter collectively referred to as a "memory cards," are constructed with memory card retention systems that removably secure a portion of the memory card within a memory card receiving area in the computer. The remaining portion of the memory card protrudes from the computer and is exposed to the outside environment.

A drawback to this memory card retention system is that the memory card and computer are vulnerable to damage from the outside environment. For example, the protruding card and computer arrangement is not sufficiently protected against water, dust, or other contaminants getting into the computer through the memory card receiving area and damaging the memory card or delicate components within the computer. Accordingly, the protruding card system is susceptible to damage from contaminants often encountered in the environment in which hand-held computers are used.

A further drawback of this protruding memory card system is that the memory card can be dislodged and fall out of the computer. The memory card and the computer are further susceptible to damage if the protruding card impacts other structures during operation, such as may occur if the computer with protruding memory card is dropped. Thus, the protruding memory card system is more likely than desired to incur damages and costly repair or replacement.

Therefore, there is need to provide a memory card retaining system that secures and protects the memory card to overcome these and other problems.

SUMMARY OF THE INVENTION

The present invention provides a sealable door assembly for use with an electronic device that removably receives a memory card through an opening formed in a housing of the device. The door assembly is shaped and sized to removably cover and seal the opening in the housing to retain the memory device and to prevent water, dust, or other contaminants from getting into and damaging the electronic device.

The sealable door assembly of the preferred embodiment essentially consists of a door having an engaging face that sealably engages the housing around the opening. A connecting member attaches to the door and to the housing so that the door is movably connected to the housing and can be moved between an open position and a closed, sealed position. A latching member attaches to the door and releasably engages a latch receiving area formed in the housing to releasably secure the door in the closed, sealed position.

A preferred embodiment of the invention has a hinge that pivotally attaches the door to the connecting member and allows the door to pivot between the open and closed, sealed positions. The connecting member is fastened to the hinge and is slidably retained in the housing by guide rails disposed within a memory card receiving chamber so the door assembly can slide between a closed position and an extended, disengaged position. The door assembly has a rigid core with a flexible outer elastomeric covering around the core, wherein the flexible outer covering forms an engaging face that engages the housing around the opening and forms a seal. Alignment guides are attached to the door that align the door in sealed engagement with the housing when the door is in the closed, sealed position.

DETAILED DESCRIPTION OF THE INVENTION

Figure 1:
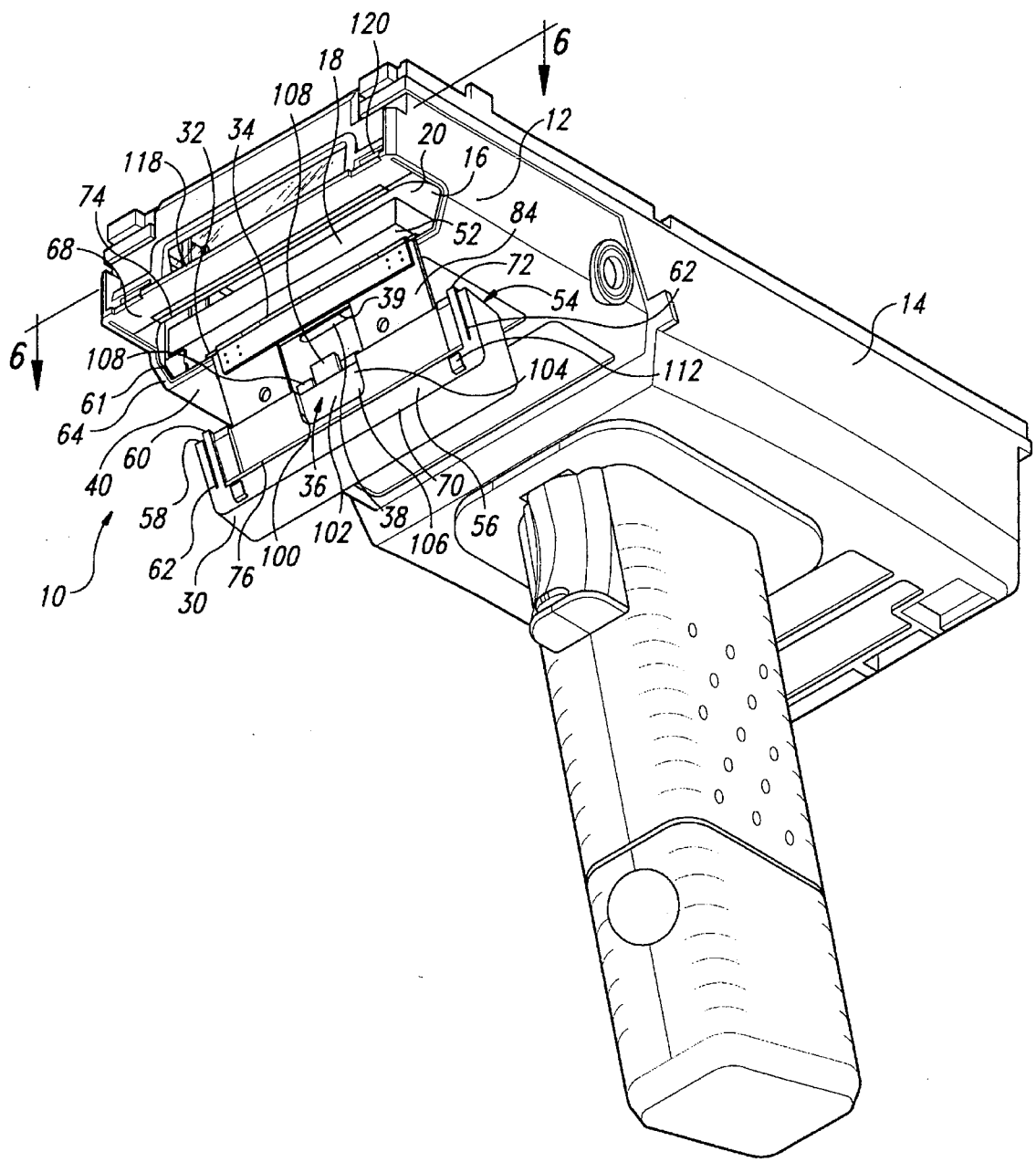
FIG. 1 is a bottom isometric view of a door assembly in accordance with the present invention connected to a housing of a hand-held computer having a memory card therein and shown with a door of the door assembly in an open position.
Figure 2:
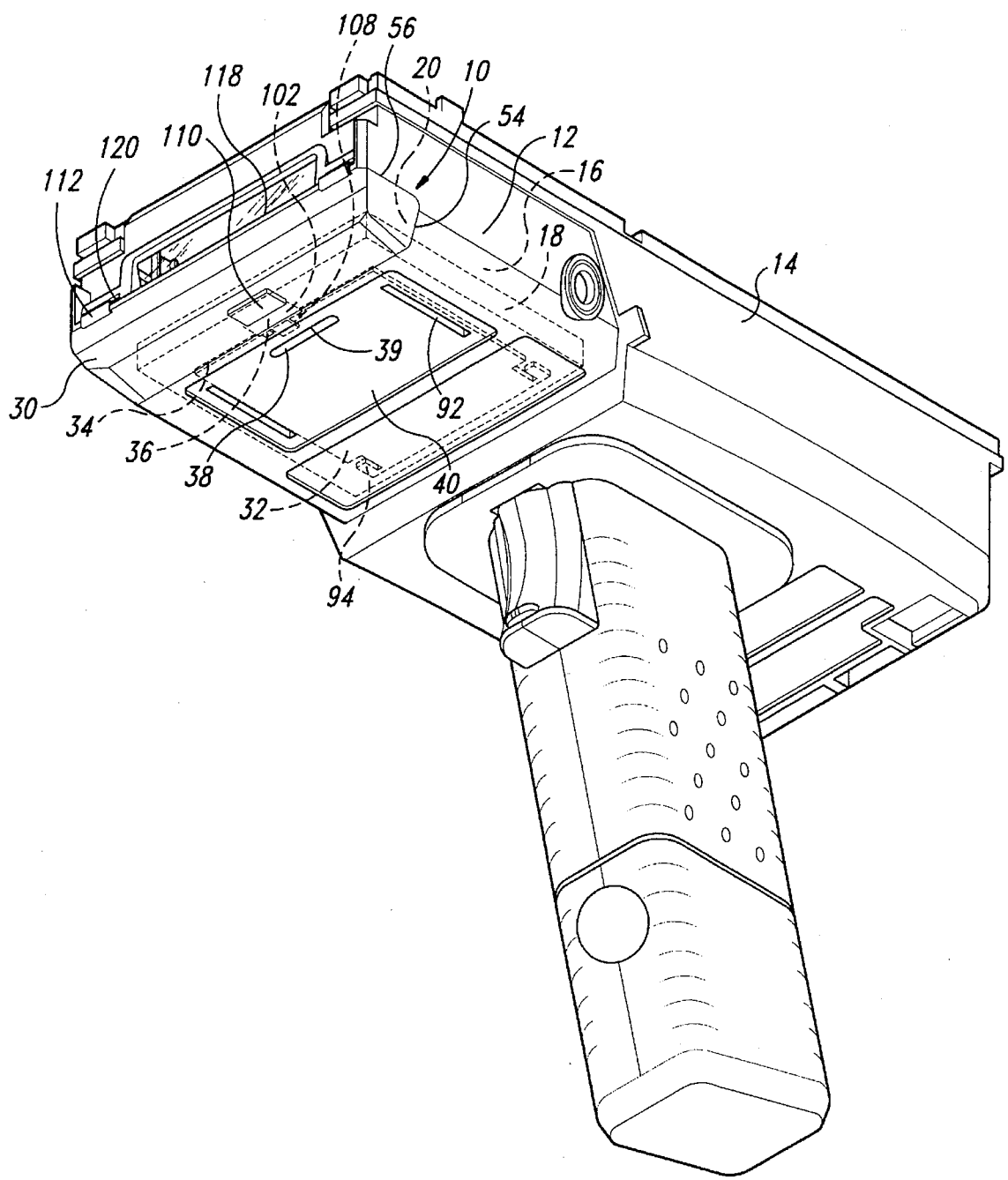
FIG. 2 is a bottom isometric view of the door assembly and hand-held computer of FIG. 1 shown with the door of the door assembly in a closed, sealed position.

A preferred embodiment of the invention is described herein and shown in the attached drawings. As best seen in FIG. 1, a door assembly 10 in accordance with the present invention is movably connected to a housing 12 of a portable, battery-powered, hand-held electronic device 14, such as a computer or bar code reading device. The housing 12 has a receiving chamber 16 therein sized to receive a memory card 18, such as a PCMCIA expanded memory card or other operator removable, interchangeable and replaceable memory device. The housing is provided with a forward opening 20 shaped and sized for passage of the memory card 18 into and out or the receiving chamber 16. The door assembly 10 engages the housing 12 and is shaped and sized to removably cover the opening 20, as best seen in FIG. 2, so that a sealing closure is provided for the opening. Accordingly, the door assembly 10 removably and sealably engages the housing 12 to protect and retain the memory card 18 in the receiving chamber 16.

Figure 6:
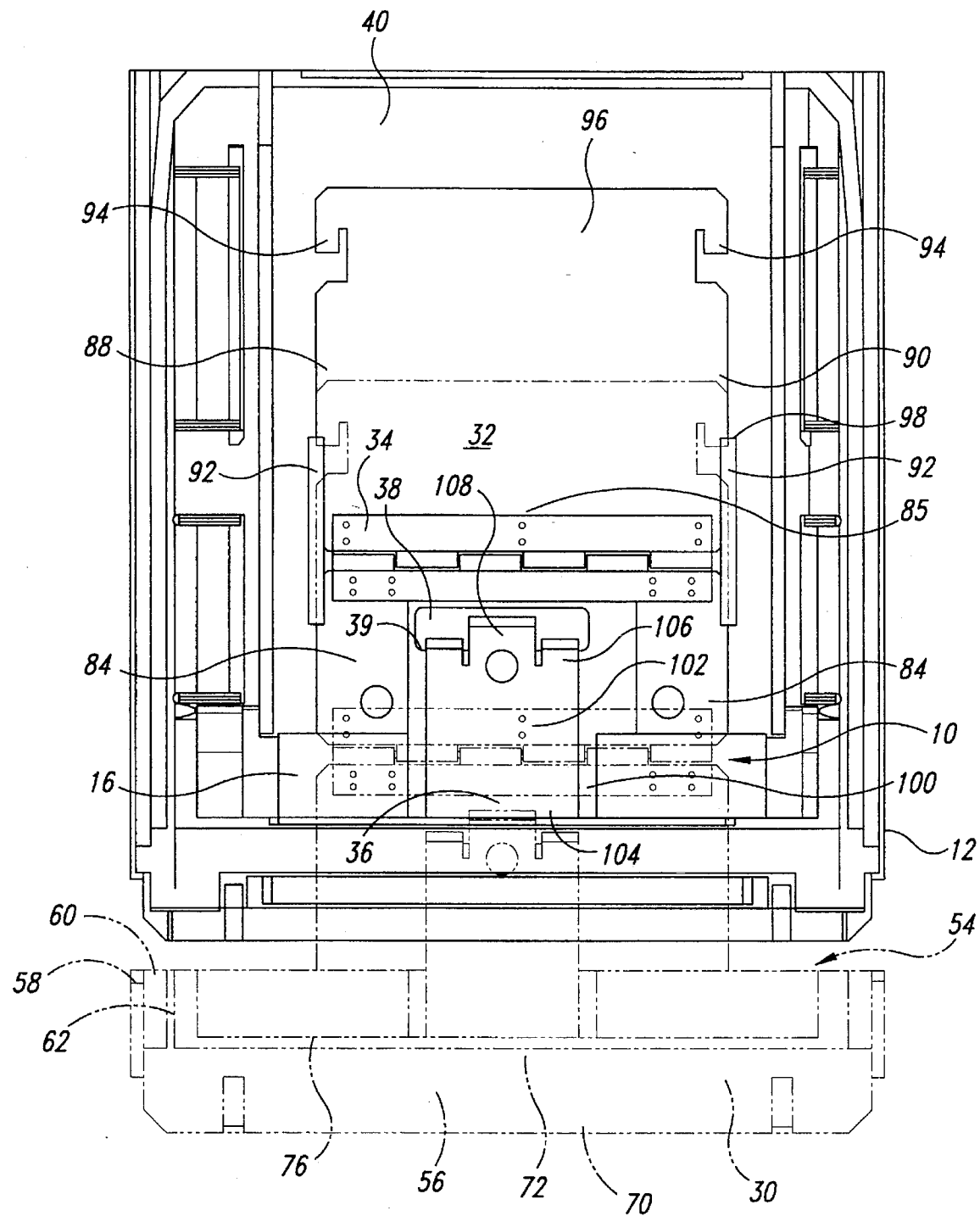
FIG. 6 is an enlarged, cross-sectional view taken substantially along line 6—6 of FIG. 1 with the memory card removed and the door assembly shown in phantom line in an extended disengaged position.

As best shown in FIGS. 1, 2, and 6, the door assembly 10 has a door 30 that is attached to a hinge 34, and the hinge is attached to a connecting plate 32 slidably mounted in the housing 12, whereby the door assembly can slide between a retracted position, shown in solid in FIGS. 2 and 6, and an extended, disengaged position, shown in phantom in FIG. 6. When the door assembly 10 is in the retracted position, the door 30 is in a closed, sealed position. When the door assembly 10 is in the extended, disengaged position, the door 30 and the hinge 34 can be pivoted between a lowered, open position, shown in FIG. 1, and a raised, intermediate position, shown in phantom in FIG. 6. From the raised, intermediate position, the door 30 can be moved to the closed, sealed position, when the door assembly 10 is moved to the retracted position shown in FIG. 2, thereby retaining the memory card 18 within the receiving chamber 16. A latch 36 is carried by the door 30 and cooperates with a latch receiving aperture 38 in a bottom panel 40 of the housing 12 to releasably secure the door in the closed, sealed position. Accordingly, the latch 36 can be moved to release the door 30, and the door can be moved from the closed, sealed position to the intermediate raised position and then pivoted downward to the open position.

Figure 3:
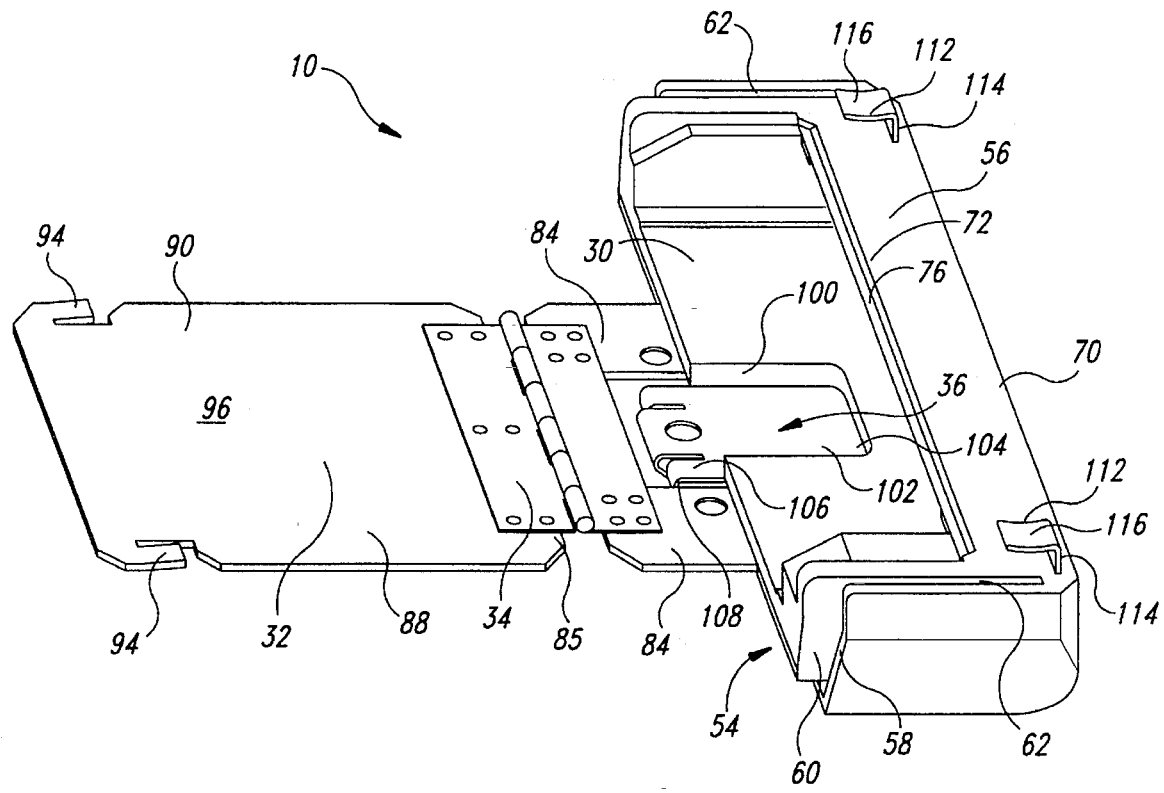
FIG. 3 is an enlarged top isometric view of the door assembly of FIG. 1 shown removed from the hand-held computer.

As best shown in FIGS. 2 and 3, the door 30 has a rear portion 54 and a top portion 56 that sealably contact the housing 12 around the opening 20 when the door 30 is in the closed position to form a water tight seal around the opening. Thus, the door 30 prevents water, dust, and other contaminants from penetrating into the receiving chamber 16 through the opening 20. In the illustrated embodiment, the opening 20 in the housing 12 is on a lower forward area of the electronic device 14, so that when the door 30 is in the closed, sealed position, it forms the lower forward corner portion of the electronic device. However, the door 30 can be adapted to cover and seal a receiving chamber's opening that is located at a different portion of the electronic device or has a different shape than that shown in the drawings.

The rear portion 54 of the door 30 has an outer engaging face 58 that forms a rearward facing, flat abutment which presses against with the housing 12 around the opening 20 when the door is in the closed, sealed position, as shown in FIG. 2. The rear portion 54 of the door 30 also has a raised portion 60 that is adjacent to the outer engaging face 58 and that extends rearward of the outer engaging face. The raised portion 60 is shaped and sized to extend through the opening 20 and into a forward portion of the receiving chamber 16, such that the raised portion engages inside surfaces 61 of the housing 12 around a portion of the opening when the door is in the closed, sealed position. The rear portion 54 is U-shaped and sized to receive a forward position 52 of the memory card 18 when the door assembly 10 is in the retracted position, thereby supporting the memory card in an installed position and protecting the memory card from being inadvertently disengaged.

The top portion 56 of the door 30 has a forward portion 70 and a rearward portion 72 that form a substantially flat, U-shaped face, as best seen in FIG. 3, that is perpendicularly oriented to the rear portion 54 of the door and is sized to receive the forward portion 52 of the memory card. When the door assembly 10 is in the retracted position with the door 30 in the closed, sealed position, as shown in FIG. 2, the top portion 56 engages an upper interior wall 68 of the receiving chamber 16 at its opening 20, so the top portion 56 and the rear portion 54 engage the housing around the opening.

The top and rear portions 54 and 56 of the door 30 have a groove 62 that extends rearwardly along left and right sides of the top portion from just rearward of the front portion 70 and around the rear portion immediately adjacent to the raised portion 60. The groove 62 is shaped and sized to snugly receive a sealing ridge 64 that is formed integrally with the housing 12 around the opening 20, as best seen in FIG. 5, to provide a seal when the door assembly 10 is in the retracted position and the door 30 is in the closed, sealed position.

Figure 5:
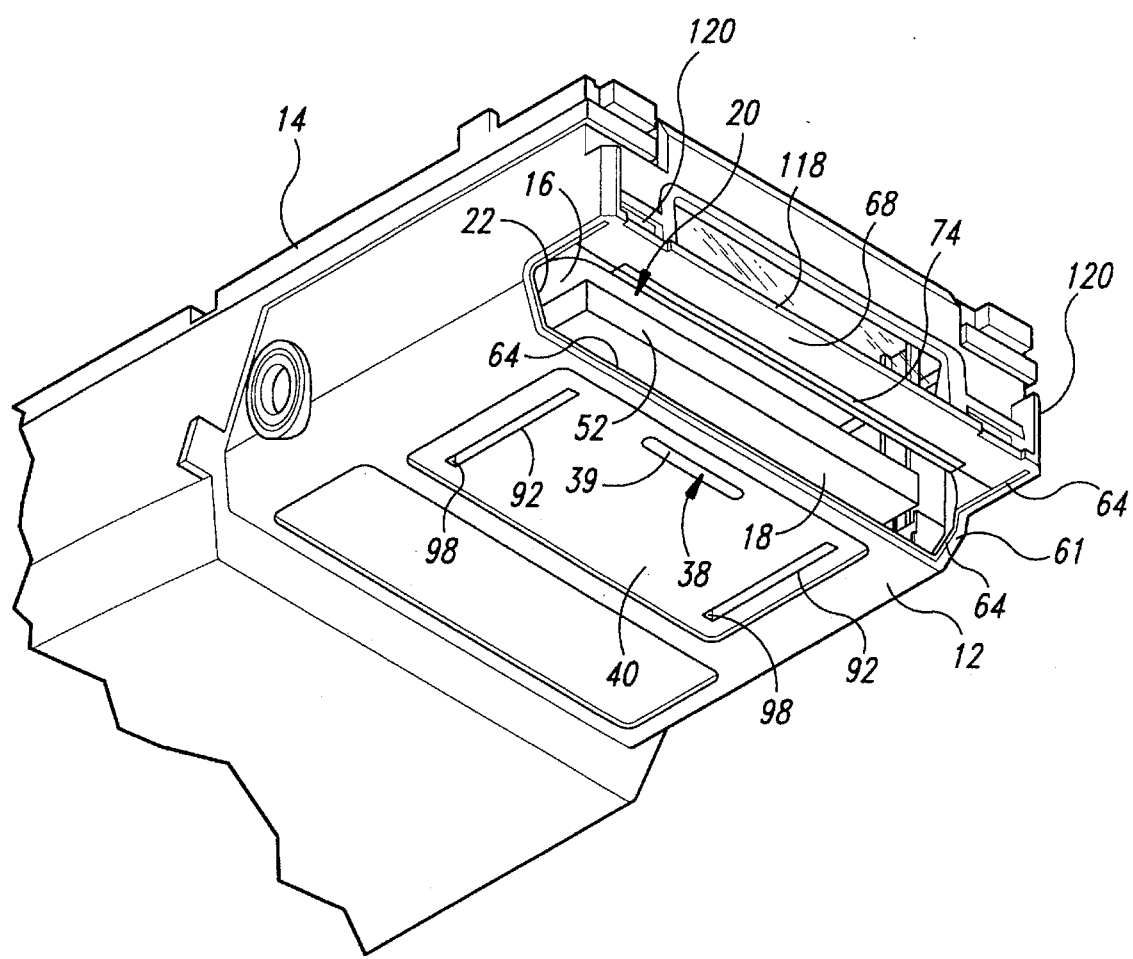
FIG. 5 is an enlarged, fragmentary bottom isometric view of the hand-held computer hobbling of FIG. 1 with the door assembly removed.

The top portion 54 of the door 30 has a stepped, recessed portion 76 extending along the rearward portion 72 between the left and right sides of the top portion, wherein the stepped recessed portion is sized and shaped to engage a ridge 74 integral with the upper interior wall 68 of the receiving chamber 16, shown in FIG. 5. The interface between the stepped recessed portion 76 and the ridge 74 provides a seal along the lop portion 54. Accordingly, when the door assembly 10 is in the retracted position with the door 30 in the closed, sealed position, the top and rear portions 54 and 56 firmly engage the housing 12 around the opening 20 with the groove 62 snugly receiving the ridge 64 and the stepped, recessed portion 76 engaging the ridge 74, thereby forming a sealed interface between the door 30 and the housing 12 around the opening, and positively retaining the memory card 18 in position within the receiving chamber 16.

The door 30 of the preferred embodiment has a substantially rigid core formed by a metal plate or the like, and an elastomeric covering molded around the core, such that the top and rear portions 54 and 56 of the door 30 are formed by the elastomeric material. The elastomeric covering is a flexible, durable material that forms the seal between the top and rear portions 54 and 56 and the housing 12, which is a rigid, molded plastic unit. Although the preferred embodiment uses a rigid metal core and an elastomeric material around the rigid core to form the door, other core materials and flexible outer covering materials could be used.

Figure 4:
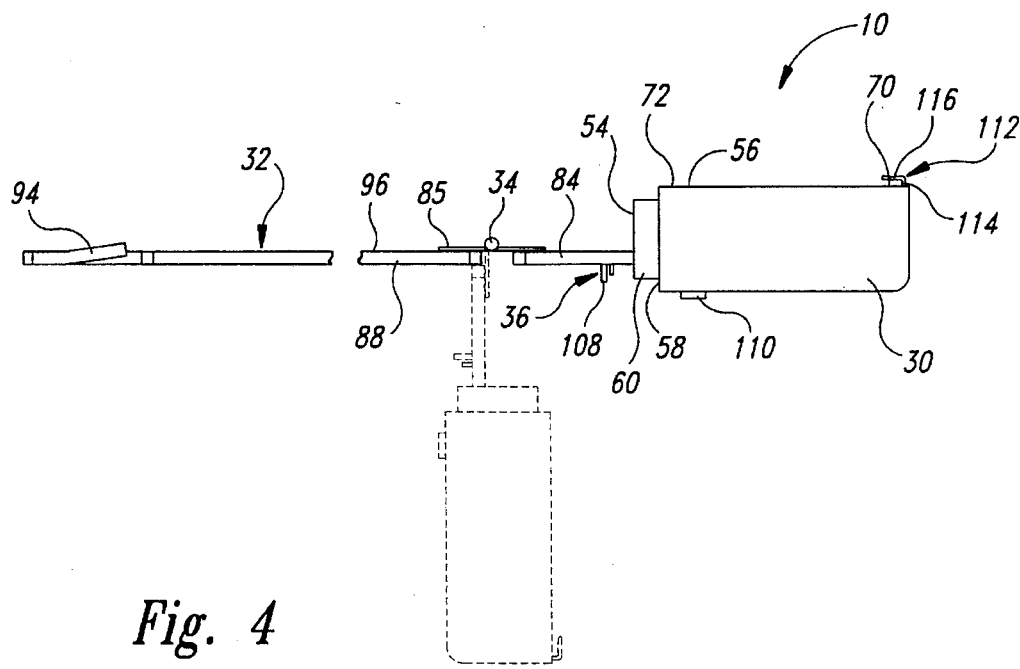
FIG. 4 is a reduced scale, side elevation view of the door assembly of FIG. 3 with the door shown in phantom line rotated to the open position.

Referring to FIGS. 3, 4, and 6, the door 30 has two metal tabs 84 that extend rearwardly from a lower side of the rear portion 54 and attached to the hinge 34. The hinge 34 also is connected to a forward portion 85 of the connecting plate 32. The hinge 34 is spot welded or otherwise securely fastened to the metal tabs 84 and to the forward portion 85 of the connecting plate 32. The connecting plate 32 is shaped and sized to slidably fit within the receiving chamber 16 of the housing 12. As shown in FIG. 6, the connecting plate 32 is slidably retained in the receiving chamber 16 by and between a pair of left and right side guide channels 92 that are attached to the bottom panel 40 of the housing 12. The guide channels 92 slidably receive left and right sides, 88 and 90, of the connecting plate 32, so that the connecting plate 32, carrying the door 30, can slide rearward into a fully retracted position, shown in solid line in FIG. 6, thereby moving the door into the closed, sealed position. In addition, the connecting plate 32 can slide forward in the guide channels 92 to move the door assembly 10 into a fully extended position, shown in phantom in FIG. 6, thereby moving the door 30 into the intermediate position, from which the door can be pivoted downward to the open position, shown in FIG. 1.

The connecting plate 32 has raised side stops 94 on the left and right sides 88 and 90 to limit the connecting plate 32 from sliding forward beyond the extended, disengaged position. The stops 94 are formed integral with the connecting plate 32 and bent upward to extend above a top surface 96 of the connecting plate 32, so as to abut a rear portion 98 of the guide channels 92 when the connecting plate 32 is slid forward to place the door assembly 10 in the extended, disengaged position. The stops 94 are positioned on the connecting plate 32 so the hinge axis of the hinge 34 is positioned within the opening 20 forward of the bottom panel 40 of the housing 12 when the door assembly 10 is in the extended, disengaged position, thereby allowing the door 30 to be pivoted into the open position.

The hinge 34 pivots the door 30 about the hinge axis between the raised intermediate position with the connecting plate 32 and the tabs 84 disposed in the same horizontal plane, as shown in solid line in FIG. 4, and the open position with the door in a substantially vertical, free-hanging orientation, as shown in phantom line in FIG. 4. Accordingly, when the door assembly 10 is slid forward to the extended, disengaged position with the hinge 34 positioned in the opening 20 forward of the bottom panel 40 of the housing 12, the door 30 can swing downward to the open position. Thus, the door 30 can be moved away from the opening 20 to expose the receiving chamber 16, as can be seen in FIG. 1, for insertion and removal or the memory card 18.

To close the door assembly 10, the door 30 is pivoted about the hinge 34 from the open position to the raised intermediate position, and the connecting plate 32, with the door connected thereto, is slid rearward along the guide channels 92 until the door assembly is in the retracted position and the door is in the closed and sealed position.

Referring to FIGS. 3 and 6, the latch 36 is movably connected to the door 30 between the tabs 84 and is disposed in a cutout area 100 in the elastomeric covering, so the elastomeric covering will not impede movement of the latch. The latch 36 has a latch plate 102 that is connected to the door 30 at a forward portion 104 of the latch plate, and that extends rearward to a rear portion 106 of the latch plate beyond the rear portion 54 of the door 30. The rear portion 106 of the latch 36 has downward bending fingers 108 that extend into the latch receiving aperture 38 or the bottom panel 40 of the housing 12 when the door is in the closed, sealed position, so the fingers engage an aperture forward edge wall 39 of the bottom panel to prevent forward movement of the door 30. As such, the latch 36 securely holds the door 30 in the closed, sealed position.

The latch 36 is arranged to bias the latch fingers 108 to snap into the latch receiving area 38 when the door 30 is moved to the closed, sealed position. The latch plate 102 is a resilient member that bends upward when the door 30 is pushed rearwardly from the raised intermediate position toward the closed position so the latch fingers 80 engage and slide along the bottom panel 40 of the housing 12 and until the latch fingers are moved into the latch receiving area. The resiliency biases the latch plate 102 so that the latch fingers 108 will snap downward into the latch receiving area 38 and engage the aperture forward edge wall 39 when the door 30 reaches the closed, sealed position.

A release button 110 is connected to an underside of the forward portion 104 of the latch plate 102 and is used to release the door assembly 10 from the retracted position. When a user presses upward on the release button 110 with sufficient force to bend the latch plate 102 upward, the latch hooks 108 are moved upward to a released position with the latch hooks clear of the aperture forward edge wall 39 of the bottom panel 40. Thereafter, the door assembly 10 can be slid from the retracted position with the door 30 in the closed, sealed position to the extended, disengaged position whereat the door can be pivoted about the hinge 34 to the open position.

As best seen in FIGS. 1, 3, and 4, the door 30 has left and right alignment guides 112 connected to the forward portion 70 of the top portion 50 of the door. Each alignment guide 112 is a substantially L-shaped member having a vertical leg 114 that extends vertically upward from the top portion 50 and a horizontal leg 116 that extends rearward so a space is provided between the horizontal leg and the top portion of the door 30. The alignment guides 112 are shaped and sized to releasably engage a lip 118 of the housing 12, shown in FIG. 1, adjacent to the upper interior wall 68 of the receiving chamber 12. Then alignment guides 112 align the door assembly 10 when the door 30 is the closed, sealed position against the housing 12. In this position, the lip 118 is tightly grasped between the horizontal leg 116 and the top portion 56 of the door 30. The housing 12 has left and right receiving areas 120 formed therein above the lip 118, wherein each of the receiving areas receives a corresponding one of the horizontal legs 116 of the left and right alignment guides 112.

When the door assembly 10 is slid into the retracted position with the door 30 in the closed, sealed position, the latch fingers 108 of the latch 36 project into the latch receiving aperture 38 and releasably engage the aperture forward edge wall 39 of the bottom panel 40. The alignment guides 112 grasp the lip 118 of the housing 12 to securely hold the door 30 sealed against the housing 12 to maintain a seal that will prevent the water, dust, and other contaminants from entering the receiving chamber 16 and damaging the electronic device 14.

Numerous modifications and variations to the sealable, latchable door for securing and protecting a memory card disclosed herein will occur to those skilled in the art in view of this disclosure. For example, the door assembly can be adapted to pivot between an open position and a closed, sealed position without sliding into or out of the housing. Therefore, it is to be understood that these modifications and variations, and equivalents thereof, may be practiced while remaining within the spirit and the scope of the invention as defined by the following claims.

We claim:

1. A sealable door assembly used with an electronic device that has a housing adapted to removably receive a memory device through an opening in the housing, the housing further including a latch receiver, the assembly comprising:

a door shaped and sized to removably cover the opening in the housing, said door having at least one engaging face with a covering thereon that is adapted to engage the housing and form a seal around the opening in the housing when in a closed position;

a connecting member retained by the housing for movement between a retracted position and an extended position, said connecting member being attached to said door, said door being carried by said connecting member, said door being movable relative to said connecting member for movement between said closed position when said connecting member is moved into said retracted position, and an open position whereat said door is sufficiently clear of the opening in the housing to permit insertion and removal of the memory device when said connecting member is moved into said extended position; and a latching member attached to said door and adapted to releasably engage the housing to secure said connecting member in said retracted position and said door in said closed position and to selectively release said connecting member for movement to said extended position whereat said door is moveable to said open position.

2. The sealable door assembly of claim 1 wherein said door includes a rigid core member and said covering surrounding at least a portion of said core member.

3. The sealable door assembly of claim 2 wherein said core member is metal.

4. The sealable door assembly of claim 2 wherein said covering is an elastomeric material molded around said rigid core member.

5. The sealable door assembly of claim 1 further including a hinge connecting said door to said connecting member, said hinge being adapted to allow said door to pivot between said open and closed positions.

6. The sealable door assembly of claim 5 for use with a housing including guide members, wherein said connecting member is slidably retained by the guide members for slidable movement between said retracted and extended positions.

7. The sealable door assembly of claim 6 further including at least one stop member attached to said connecting member and positioned to prevent said connecting member from sliding outward beyond said extended position.

8. The sealable door assembly of claim 1 further including alignment guides attached to said door and adapted to align said door with said housing when moved into said closed position.

9. The sealable door assembly of claim 1 wherein said connecting member is a plate.

10. A housing assembly for containing a portable computer that is adapted to use a removable computer memory device, the assembly comprising:

a housing having a receiving chamber and an opening providing access to said receiving chamber, said opening being sized for passage of the removable computer memory device therethrough and said receiving chamber being sized and shaped to receive the removable memory device therein;

a door movably coupled to said housing, said door sized and shaped to removably cover said opening in said housing, said door having at least one engaging face with a covering thereon that is adapted to engage said housing and form a seal around said opening in said housing when in a closed position; and a connecting member retained by the housing for movement between a retracted position and an extended position, said connecting member being attached to said door, said door being carried by said connecting member, said door being moveable relative to said connecting member for movement between said closed position when said connecting member is moved into said retracted position, and an open position whereat said door is sufficiently clear of the opening in said housing to permit insertion and removal of the memory card device when said connecting member is moved into said extended position.

11. The sealable housing assembly of claim 10 wherein said door includes a rigid core member with said covering surrounding said rigid core member.

12. The sealable housing assembly of claim 11 wherein said rigid core member is metal.

13. The sealable housing assembly of claim 11 wherein said covering is a elastomeric material molded around said rigid core member.

14. The sealable housing assembly of claim 10 wherein said covering is a elastomeric material.

15. The sealable housing assembly of claim 10 further including a latching means attached to said door, said latching means adapted to releasably engage said housing in a latch receiving area.

16. The sealable housing assembly of claim 10 further including a hinge connecting said door to said connecting member, said hinge being adapted to allow said door to pivot between said open and closed positions.

17. The sealable housing assembly of claim 16 wherein said housing further includes guide members in said receiving chamber, and said connecting member is slidably retained by said guide members for slidable movement between said retracted and extended positions.

18. The sealable housing assembly of claim 17 further including at least one stop member attached to said connecting member and positioned to prevent said connecting member from sliding outward beyond said extended position.

19. The sealable housing assembly of claim 10 further including alignment guides attached to said door and adapted to align said door with said housing when moved into said closed position.

20. The sealable housing assembly of claim 10 wherein said connecting member is a plate.

* * * * *